US009423420B2

(12) United States Patent
Panagas

(10) Patent No.: US 9,423,420 B2
(45) Date of Patent: Aug. 23, 2016

(54) TESTING SYSTEM WITH TEST TRAYS

(75) Inventor: Peter G. Panagas, Santa Clara, CA (US)

(73) Assignee: Apple Inc., Cupertino, CA (US)

(*) Notice: Subject to any disclaimer, the term of this patent is extended or adjusted under 35 U.S.C. 154(b) by 500 days.

(21) Appl. No.: 13/472,399

(22) Filed: May 15, 2012

(65) Prior Publication Data

US 2013/0200913 A1   Aug. 8, 2013

Related U.S. Application Data

(60) Provisional application No. 61/595,572, filed on Feb. 6, 2012.

(51) Int. Cl.
*G01R 1/04* (2006.01)
*G01R 31/28* (2006.01)
*H01L 21/677* (2006.01)
*G06F 3/044* (2006.01)
*H04M 1/24* (2006.01)
*G01R 31/01* (2006.01)

(52) U.S. Cl.
CPC .......... *G01R 1/0441* (2013.01); *G01R 31/2893* (2013.01); *G06F 3/044* (2013.01); *H01L 21/67727* (2013.01); *H04M 1/24* (2013.01); *G01R 31/01* (2013.01); *G06F 2203/04103* (2013.01); *H01L 2924/0002* (2013.01)

(58) Field of Classification Search
CPC ....... H04M 1/24; G01R 1/0408; G01R 31/01; G01R 31/2808; G01R 31/2863; G01R 31/2867; G01R 31/2893
See application file for complete search history.

(56) References Cited

U.S. PATENT DOCUMENTS

| | | | | |
|---|---|---|---|---|
| 5,180,975 A | * | 1/1993 | Andoh et al. | 324/537 |
| 5,773,983 A | | 6/1998 | Cochran et al. | |
| 5,903,645 A | * | 5/1999 | Tsay | 379/455 |
| 6,262,571 B1 | * | 7/2001 | Krajec | 324/754.08 |
| 6,388,437 B1 | | 5/2002 | Wolski et al. | |

(Continued)

FOREIGN PATENT DOCUMENTS

| | | |
|---|---|---|
| CN | 1160202 A | 9/1997 |
| CN | 1975440 | 6/2007 |

(Continued)

OTHER PUBLICATIONS

Interchangeable Electrical Connections for Testing Conveyor-Borne Products, IBM Technical Disclosure Bulletin, vol. 26, Issue No. 3a, pp. 1018-1019, Aug. 1983.*

*Primary Examiner* — Tung X Nguyen
*Assistant Examiner* — Adam Clarke
(74) *Attorney, Agent, or Firm* — Treyz Law Group, P.C.; Kendall P. Woodruff; Zachary D. Hadd

(57) ABSTRACT

A test system may be provided in which devices under test are loaded into test trays and tested at a plurality of test stations. To test a device under test at a given test station, the test tray may be installed into a test fixture at the test station. Test equipment at each test station may communicate with the device under test via the test fixture and the test tray. Each test tray may have a spring-loaded corner portion that may be used to secure the device under test to the test tray. The test tray may have contacts that mate with corresponding contacts at each test fixture and may have a built in cable that connects to the device under test. The test fixture may have a detector that can detect whether or not a test tray is present on the test fixture.

24 Claims, 13 Drawing Sheets

(56) References Cited

U.S. PATENT DOCUMENTS

| | | | |
|---|---|---|---|
| 6,492,823 B1 * | 12/2002 | Euker | 324/756.01 |
| 6,509,753 B2 * | 1/2003 | Euker | 324/756.02 |
| 6,678,583 B2 | 1/2004 | Nasr et al. | |
| 6,681,142 B2 * | 1/2004 | Schinkowitsch | 700/108 |
| 6,752,391 B1 * | 6/2004 | Euker | 269/289 R |
| 6,759,842 B2 | 7/2004 | Weimer | |
| 6,856,155 B2 | 2/2005 | Tay et al. | |
| 7,065,693 B2 | 6/2006 | Konuk | |
| 7,388,977 B2 * | 6/2008 | Wang et al. | 382/141 |
| 7,528,596 B2 * | 5/2009 | Ivannikov et al. | 324/750.16 |
| 7,960,992 B2 * | 6/2011 | Co et al. | 324/757.01 |
| 8,074,344 B2 * | 12/2011 | Hanaoka et al. | 29/598 |
| 2003/0178987 A1 | 9/2003 | Suzuki | |
| 2003/0188997 A1 | 10/2003 | Tan et al. | |
| 2003/0198551 A1 | 10/2003 | Schmidt et al. | |
| 2005/0105997 A1 * | 5/2005 | Englhardt et al. | 414/626 |
| 2006/0000083 A1 | 1/2006 | Dangelo et al. | |
| 2007/0063721 A1 | 3/2007 | Dozier et al. | |
| 2007/0132259 A1 | 6/2007 | Ivannikov | |
| 2009/0153992 A1 | 6/2009 | Garcia et al. | |
| 2009/0278297 A1 | 11/2009 | Wang | |
| 2011/0041312 A1 * | 2/2011 | Hofmann | 29/464 |
| 2011/0043231 A1 * | 2/2011 | Richter et al. | 324/750.05 |
| 2011/0102276 A1 * | 5/2011 | Jimenez | G01R 29/10 343/703 |
| 2011/0199092 A1 * | 8/2011 | Jiang et al. | 324/437 |
| 2011/0227597 A1 * | 9/2011 | Leino et al. | 324/756.07 |
| 2011/0301901 A1 * | 12/2011 | Panagas | 702/104 |
| 2011/0301902 A1 * | 12/2011 | Panagas | 702/104 |
| 2012/0137512 A1 * | 6/2012 | Di Stefano | 29/825 |
| 2012/0286815 A1 * | 11/2012 | Chen et al. | 324/755.01 |
| 2012/0293379 A1 * | 11/2012 | Nickel et al. | 343/703 |

FOREIGN PATENT DOCUMENTS

| | | | | |
|---|---|---|---|---|
| CN | 1989415 | | 6/2007 | |
| CN | 101101307 A | | 1/2008 | |
| CN | 201118707 | | 9/2008 | |
| CN | 201126814 Y | | 10/2008 | |
| CN | 101342532 | | 1/2009 | |
| CN | 101574798 | | 11/2009 | |
| CN | 101939785 | | 1/2011 | |
| JP | 2001174526 | | 6/2001 | |
| JP | 2004354171 A | * | 12/2004 | G01R 29/10 |
| TW | 544745 | | 8/2003 | |
| TW | 200734655 | | 9/2007 | |
| WO | 8805544 | | 7/1988 | |
| WO | 91/11094 A3 | | 1/1992 | |
| WO | WO 2005054877 A1 | * | 6/2005 | G01R 1/04 |
| WO | 2006116767 | | 11/2006 | |
| WO | 2007043177 | | 4/2007 | |
| WO | 2008/032983 A1 | | 3/2008 | |
| WO | 2011086140 | | 7/2011 | |

* cited by examiner

TESTING SYSTEM WITH TEST TRAYS

This application claims the benefit of provisional patent application No. 61/595,572, filed Feb. 6, 2012, which is hereby incorporated by reference herein in its entirety.

BACKGROUND

This relates generally to testing systems, and, more particularly, to testing systems that use test trays as an interface between test equipment and devices under test.

Electronic devices are often tested following assembly to ensure that device performance meets design specifications. For example, a device may be tested at a series of test stations to ensure that components and software in the device are operating satisfactorily. At each test station, an operator may couple a device to test equipment using a cable. Following successful testing at all test stations, a device may be shipped to an end user.

The process of attaching and detaching test cable connectors can reduce the lifetime of the test cable connectors and can be cumbersome and burdensome to test system operators. If care is not taken, tests may be less accurate and more time consuming than desired. Additionally, excessive contact between a test system operator and a device under test may increase the risk of cosmetic damage to the device under test.

It would therefore be desirable to be able to provide improved ways of performing manufacturing operations such as testing operations on electronic devices.

SUMMARY

A test system may be provided in which devices under test are installed in test trays and tested at a plurality of test stations. To test a device under test at a given test station, the test tray may be installed in a test fixture at the test station. Test equipment at each test station may communicate with the device under test via the test tray.

Each test tray may have a movable corner portion that moves with respect a central portion of the tray. One or more spring-loaded members may be used to bias the movable corner portion towards the central portion of the tray. When it is desired to install a device under test in the test tray, a lever on the test tray may be actuated to move the corner portion away from the central portion of the tray. After placing the device under test onto the central portion of the test tray, the lever may be released to allow the corner portion to return to its equilibrium position, thereby securing the device under test to the test tray.

The test tray may have test tray contacts that may be used to electrically couple the device under test in the test tray to a test fixture at a test station. The test fixture may have corresponding test fixture contacts that mate with the contacts on the test tray.

The test tray may be provided with one or more cables. The cables may be embedded in grooves in the test tray. A test tray cable may have a first end that is configured to mate with an input-output port in the device under test and a second end that is electrically coupled to the test tray contacts. The cable may be used to convey signals between the test fixture and the device under test when the test tray is installed in the test fixture.

The test tray may have weight balancing features such as holes for balancing the weight of the test tray with respect to a rotational axis of the test tray. The weight balancing features may be used to align the center of mass of the tray with the center of mass of the device under test when it is installed in the tray.

The test fixture may have engagement features such as one or more spring-loaded members that engage with corresponding engagement features on the test tray when it is installed in the test fixture.

The test fixture may have one or more detectors that are configured to detect whether or not a test tray is present on the test fixture.

The test fixture may have test equipment that may be used to test one or more electrical components in a device under test. The test tray may be provided with one or more openings to allow the test equipment to communicate with the electrical component being tested.

After installing a device under test into a test tray, a test tray cable may be connected to the device under test. The test tray may then be installed in a test fixture at a test station by mating the test tray contacts with the test fixture contacts. Following installation of the test tray in the test fixture, the device under test may be tested at the test fixture. The device under test may be tested at additional test stations without requiring the step of removing the device under test from the test tray or detaching the test tray cable from the device under test. The device under test may be tested at additional test stations by installing the test tray into the test fixture associated with each additional test station.

Further features of the invention, its nature and various advantages will be more apparent from the accompanying drawings and the following detailed description of the preferred embodiments.

DETAILED DESCRIPTION

Figure 1:
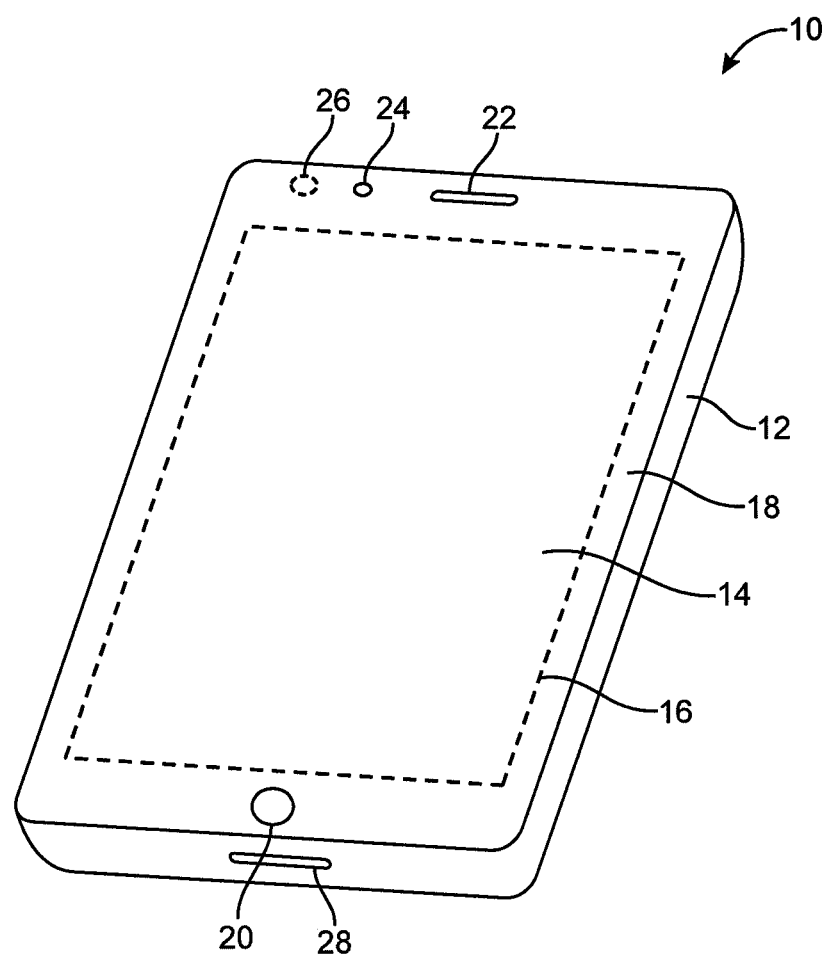
FIG. 1 is a schematic diagram of an illustrative electronic device such as a tablet computer that may be manufactured using a test tray in accordance with an embodiment of the present invention.

Electronic devices such as electronic device 10 of FIG. 1 may be manufactured using automated manufacturing equipment. The automated manufacturing equipment may include equipment for assembling device components together to form an electronic device. The automated manufacturing equipment may also include testing systems for evaluating whether devices have been properly assembled and are functioning properly.

Devices such as device 10 of FIG. 1 may be assembled and tested using an automated manufacturing system and associated test apparatus. The manufacturing system may include one or more stations such as one or more test stations for performing testing operations.

Devices that are being tested in a test system may sometimes be referred to as devices under test. Devices under test may be provided to the test stations using a conveyor belt, using robotic arms, and/or using other loading equipment. If desired, devices under test may be conveyed between test stations by a test system operator.

Test equipment at each test station may be used to perform an associated test on a device. For example, one test station may have equipment for testing a display in the device. Another test station may have equipment for testing an audio component in the device. Yet another test station may have equipment for testing light sensors in the device. Yet another test station may have equipment for testing wireless communications circuitry in the device. Automated equipment in the test system may be used in loading and unloading devices under test, in conveying devices under test between test stations, and in performing tests and maintaining a database of test results.

Any suitable devices may be tested using the test equipment. As an example, device 10 of FIG. 1 may be tested. Device 10 may be a computer monitor with an integrated computer, a desktop computer, a television, a notebook computer, other portable electronic equipment such as a cellular telephone, a tablet computer, a media player, a wrist-watch device, a pendant device, an earpiece device, other compact portable devices, or other electronic equipment. In the configuration shown in FIG. 1, device 10 is a handheld electronic device such as a cellular telephone, media player, navigation system device, or gaming device.

As shown in FIG. 1, device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may be a touch screen that incorporates capacitive touch electrodes or may be insensitive to touch. Display 14 may include image pixels formed from light-emitting diodes (LEDs), organic LEDs (OLEDs), plasma cells, electrophoretic display elements, electrowetting display elements, liquid crystal display (LCD) components, or other suitable image pixel structures. A cover glass layer may cover the surface of display 14. Openings for buttons such as button 20, openings for speaker ports such as speaker port 22, and other openings may be formed in the cover layer of display 14, if desired.

The central portion of display 14 (e.g., active region 16) may include active image pixel structures. The surrounding rectangular ring-shaped inactive region (region 18) may be devoid of active image pixel structures. If desired, the width of inactive region 18 may be minimized (e.g., to produce a borderless display).

Device 10 may include components such as front-facing camera 24. Camera 24 may be oriented to acquire images of a user during operation of device 10. Device 10 may include sensors in portion 26 of inactive region 18. These sensors may include, for example, an infrared-light-based proximity sensor that includes an infrared-light emitter and a corresponding light detector to emit and detect reflected light from nearby objects. The sensors in portion 26 may also include an ambient light sensor for detecting the amount of light that is in the ambient environment for device 10. Other types of sensors may be used in device 10 if desired. The example of FIG. 1 is merely illustrative.

Device 10 may include input-output ports such as port 28. Ports such as port 28 may include audio input-output ports, analog input-output ports, digital data input-output ports, or other ports. Each port may have an associated connector. For example, an audio port may have an associated four-contact audio connector, a digital data port may have a connector with two or more pins (contacts), a connector with four or more pins, a connector with thirty pins, or other suitable data port connector.

Sensors such as the sensors associated with region 26 of FIG. 1, cameras such as camera 24, audio ports such as speaker port 22, buttons such as button 20, and ports such as port 28 may be located on any suitable portion of device housing 12 (e.g., a front housing face such as a display cover glass portion, a rear housing face such as a rear planar housing wall, sidewall structures, etc.).

Figure 2:
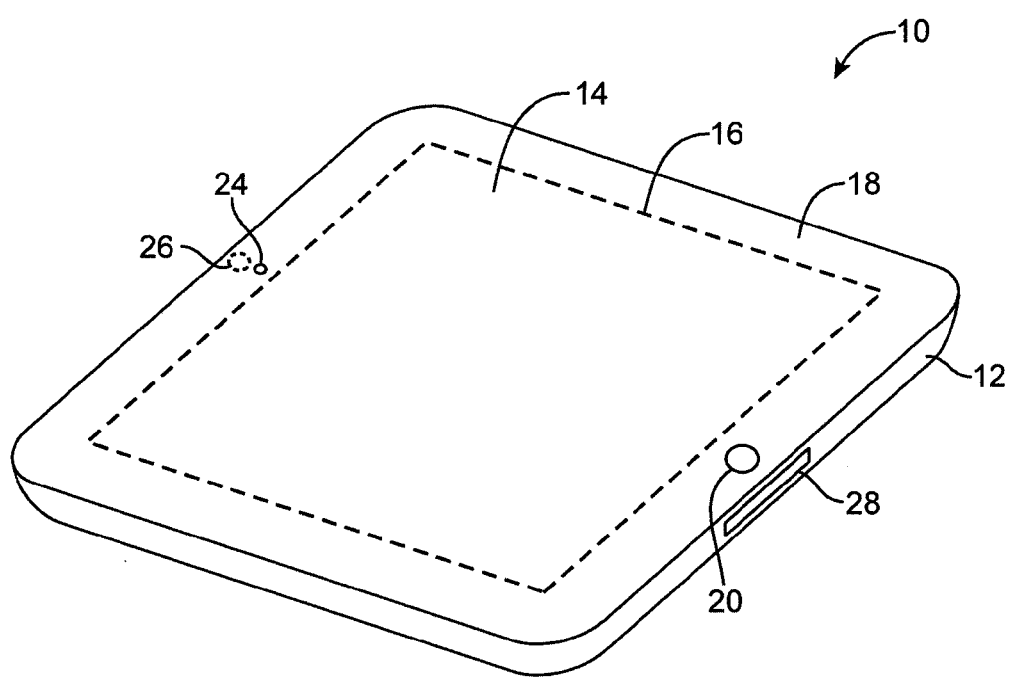
FIG. 2 is a perspective view of an illustrative electronic device such as a handheld device of the type that may be manufactured using a test tray in accordance with an embodiment of the present invention.

FIG. 2 is a perspective view of device 10 in an illustrative configuration in which device 10 is a tablet computer. As shown in FIG. 2, device 10 may include a housing such as housing 12. Housing 12 may be formed from metal, plastic, fiber-based composite material, glass, ceramic, other materials, or combinations of these materials. Device 10 may have an upper (front) surface that is covered with display 14. Active portion 16 of display 14 may have a rectangular shape (as an example). Inactive portion 18 of display 14 may have an opening to accommodate button 20, a window region for camera 24, and a portion such as portion 26 that is associated with one or more optical sensors such as an infrared-based proximity sensor and/or an ambient light sensor.

Figure 3:
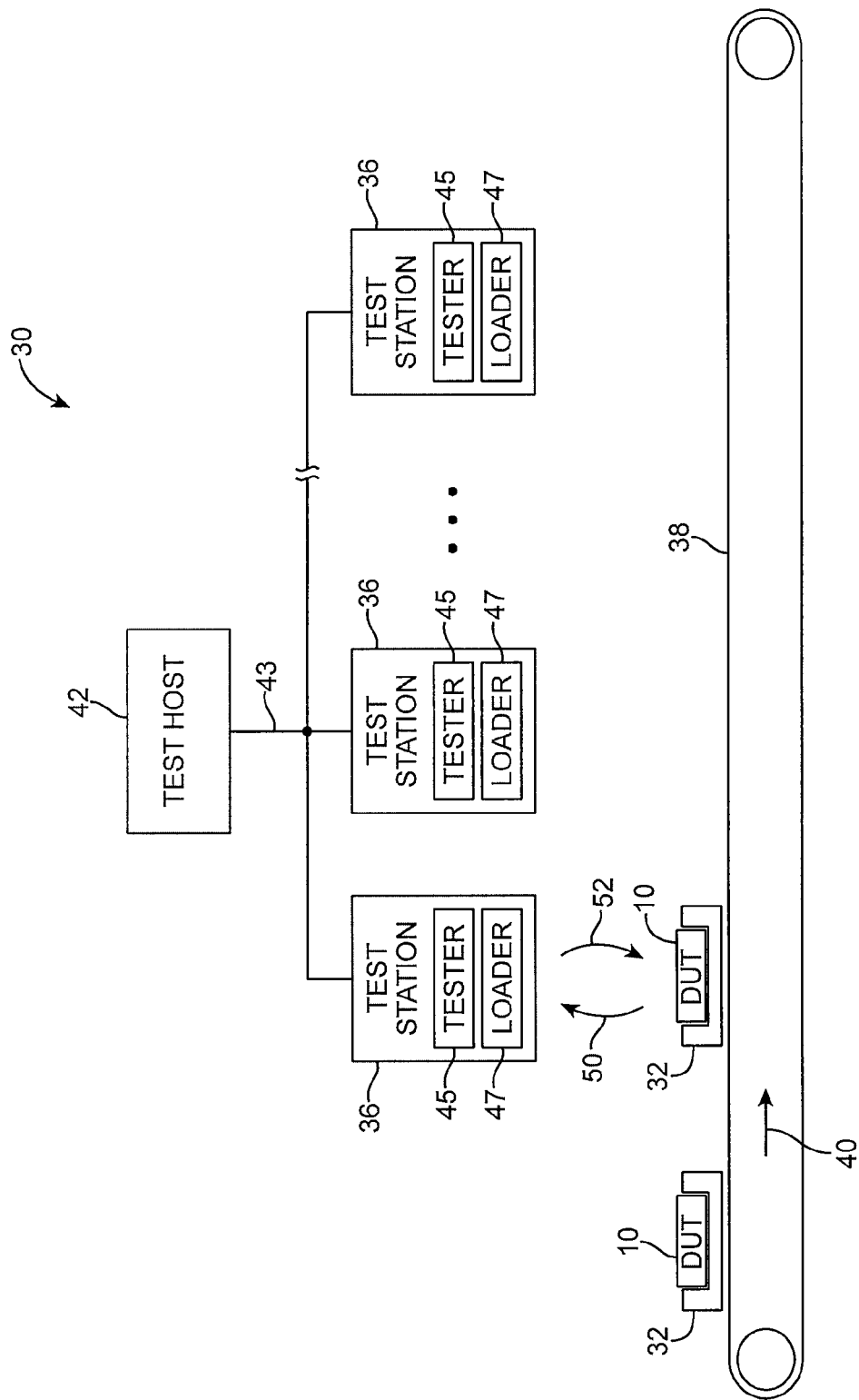
FIG. 3 is a diagram of manufacturing equipment of the type that may be used in manufacturing an electronic device in accordance with an embodiment of the present invention.

FIG. 3 is a diagram of an illustrative system of the type that may be used for manufacturing operations such as device testing. As shown in FIG. 3, system 30 may include one or more stations such as test stations 36. In general, test system 30 may include automated equipment that is used in loading and unloading devices under test, in conveying devices under test between test stations, and in performing tests and maintaining a database of test results.

Each test station 36 may, for example, include test equipment 45 for performing one or more tests on device under test 10 and may therefore sometimes be referred to as a device tester or DUT tester. For example, a first type of test station 36 may have equipment for testing a display in device under test 10. A second type of test station 36 may have equipment for testing an audio component in device under test 10. Yet another type of test station 36 may have equipment for testing light sensors in device under test 10. Yet another type of test station 36 may have equipment for testing wireless communications circuitry in device under test 10. If desired, test system 30 may include more than one test station of the same type arranged along conveyor belt 38 so that multiple devices under test 10 can be tested in parallel.

Device under test 10 may, if desired, be installed in a test tray such as tray 32. Tray 32 may be configured to receive one or more devices under test. For example, tray 32 may have multiple slots, each of which is configured to receive a corresponding device under test. If desired, tray 32 may be configured to receive only a single device under test.

Device 10 may be installed in test tray 32 manually or using automated equipment. To facilitate manual installation, test tray 32 may include features to facilitate human manipulation. For example, test tray 32 may include features that help an operator open and close clamps or other device holding features in test tray 32.

If desired, devices under test 10 that have been mounted in test trays 32 may be conveyed between test stations 36 using a conveyor belt such as conveyor belt 38 (e.g., a belt that moves in direction 40). Each test station 36 may be provided with loading mechanisms such as loader 47 (e.g., a robotic loader with one or more computer-controlled positioning arms) and/or may have an associated test system operator. A test system operator and/or loader 47 may transfer test trays 32 between conveyor belt 38 and test stations 36. For example, a test system operator and/or loader 47 may pick up test tray 32 (e.g., a test tray that is loaded with device 10) from conveyor 38 (arrow 50), may present the test tray to tester 45 at that test station to perform desired testing of device 10, and may return the test tray to conveyor 38 following testing (arrow 52). Test trays 32 may also, if desired, be transferred directly from one test station to another test station.

Test trays 32 may allow a test system operator to handle devices under test 10 without having to make physical contact with devices under test 10. Test tray 32 may serve as both an interface between device under test 10 and a test system operator as well as an interface between device under test 10 and a test station. Test tray 32 may, for example, be more robust than device under test 10, may have engagement features that are configured to mate with a test station text fixture at test station 36, may have an identification number that facilitates tracking, and may have other features that facilitate testing of device under test 10 by test stations 36.

Test stations 36 may provide test results to computing equipment such as test host 42 (e.g., one or more networked computers) for processing. Test host 42 may maintain a database of test results, may be used in sending test commands to test stations 36, may track individual trays and devices under test as the trays and devices pass through system 30, and may perform other control operations.

Figure 4:
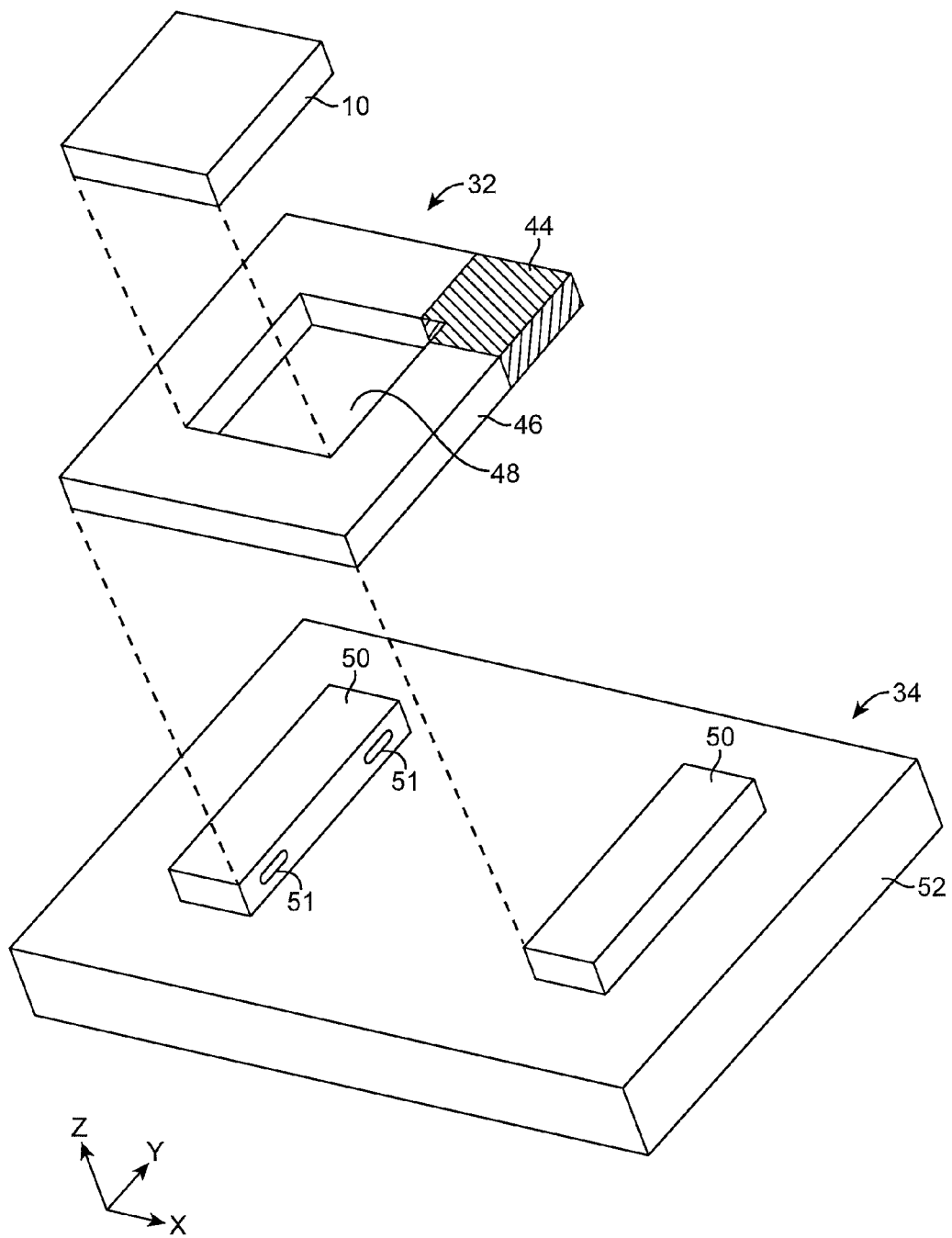
FIG. 4 is a diagram showing how a device under test may be mounted in a test tray that is configured to be received within a test station test fixture in accordance with an embodiment of the present invention.

FIG. 4 is a diagram showing how device under test 10 may be received within test tray 32 and showing how test tray 32 may be received within guiding structures 50 of test fixture 34. As shown in FIG. 4, test tray 32 (sometimes referred to as device under test receiving structure, device under test holder, or device-to-test-fixture interface structure) may have a base such as base 48 on which device under test 10 rests. Sidewalls 46 may be configured to surround some or all of the sides of device under test 10 and may contain device locating features such as tangential surfaces and notches. A portion of sidewall structures 46 such as corner portion 44 of sidewall structures 46 may be movable relative to a central portion of tray 32 (e.g., relative to device under test 10 when it is installed in tray 32). During installation of device under test 10 into the recess formed by sidewalls 46 and base 48, portion 44 may be moved away from sidewalls 46 to allow device under test 10 to be inserted into the recess. Following insertion of device under test into the recessed portion of tray 32, portion 44 may move backwards towards device under test 10 to hold device under test 10 within tray 32.

Test fixture 34 may have a support structure such as base 52 to which guiding structures 50 are attached. Guiding structures 50 may be configured to receive the exterior portions of sidewalls 46 of test tray 32. Engagement features on guiding structures 50 and/or tray 32 may help hold tray 32 in place within test fixture 34 during testing.

Figure 5:
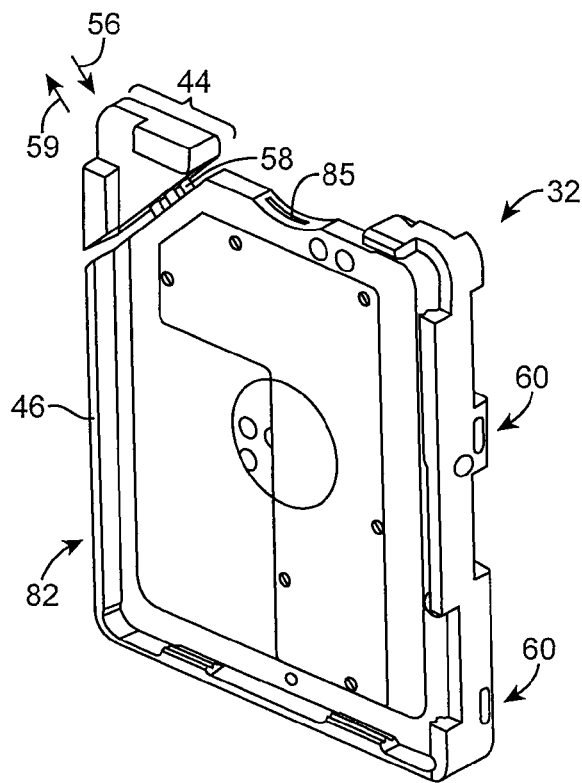
FIG. 5 is a front perspective view of a test tray in accordance with an embodiment of the present invention.

FIG. 5 is a front perspective view of test tray 32. As shown in the illustrative configuration of FIG. 5, test tray 32 may have spring-loaded corner portion 44. To load device under test 10 into test tray 32, corner portion 44 and associated bars 58 may be moved in direction 59. Corner portion 44 may be biased inwardly (e.g., towards a central portion of test tray 32) using springs or using other types of spring-loaded members. After device under test 10 has been loaded into test tray 32, corner portion 44 may be released. The springs associated with corner portion 44 may bias corner portion 44 inwardly in direction 56 to hold device under test 10 within test tray 32.

Test tray 32 may have engagement features such as recesses 60 in sidewalls 46. Recesses 60 (sometimes referred to as openings, slots, or grooves may be configured to mate with corresponding engagement features on guiding structures 50 of test fixture 34 such as features 51 of FIG. 4.

Figure 6:
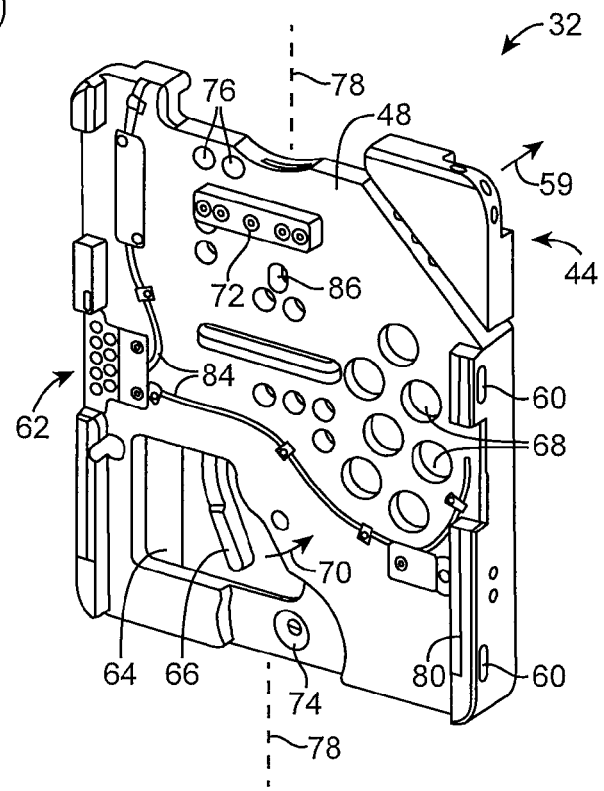
FIG. 6 is a rear perspective view of a test tray in accordance with an embodiment of the present invention.

FIG. 6 is a rear perspective view of test tray 32. As shown in FIG. 6, base 48 may have an opening such as opening 64 through which an operator may operate an actuating member such as actuating member 66. In the example of FIG. 6, actuating member 66 has been implemented in the form of a lever. When an operator desires to load device under test 10 into the front of tray 32 (or unload device under test 10 from the front of tray 32), the operator's fingers may be placed in finger holes 68 and the operator's thumb may be placed on lever 66 to pull lever 66 in direction 70. The lever may pivot (internally) about pivot point 72, pressing spring-loaded bars 58 and corner portion 44 of sidewalls 46 outwards in direction 59. If desired, other types of actuating members may be used to control corner portion 44 (e.g., one or more buttons, switches, and/or other types of actuators may be used to control corner portion 44).

If desired, an automated loader may be used to assist an operator in opening and closing corner portion 44. The automated loader may contain a computer-controlled actuator that pulls lever 66.

Tray 32 may have holes such as hole 74 to facilitate test measurements on device under test 10 during testing. For example, openings such as hole 74 may be used to allow light from a test light source to reach an ambient light sensor in region 26 of device under test 10 (FIG. 2) (e.g., when device under test 10 has been loaded face down into test tray 32). Openings such as hole 74 may also be used to allow a magnetic sensor in device 10 to be tested (e.g., by allowing a magnet to be placed in proximity to a magnetic sensor in device 10).

Tray 32 may have weight balancing features such as holes 76 to help ensure that tray 32 is rotationally weight balanced with respect to rotational axis 78. The rotational balancing of the mass (weight) within tray 32 may facilitate positioning of test tray 32 using positioning equipment in system 30 such as loaders 47 and/or loading arms in test stations 36 and may allow device 10 to be rotated for testing (e.g., for testing of motion sensors such as accelerometers). Balancing holes 76 may be configured so that the center of mass of tray 32 is aligned with the center of mass of device under test 10.

It may be desirable to stack test trays during use in system 30. Stacking features such as stacking features 80 may be formed on portions of sidewalls 46 so that multiple trays such as trays 32 can be stacked on top of each other. When stacked, stacking features such as sidewall stacking feature 80 may rest on mating portions of sidewall 46 such as stacking feature portion 82 in FIG. 5.

Test tray 32 may have electrical contacts such as contacts 62 (sometimes referred to as pins, contact pads, or pads). When device under test 10 is loaded into tray 32, a cable may be used to connect one or more connector ports in device under test 10 to contacts 62. Slot 85 may, if desired, serve as a temporary connector holder for receiving the connector at one end of the cable. Tray 32 may include grooves such as grooves 84 that for routing cables within base 48.

One end of a cable may be configured to mate with a device port such as port 28 of FIG. 2 using a connector. The opposing end of the cable may be terminated at contacts 62. Contacts 62 may be, for example, contact pads formed from nickel plated with gold. Contacts 62 may be configured to mate and form electrical connections with corresponding spring-loaded pins or other contacts in test fixture 34.

The use of test tray 32 and test fixture 34 may allow devices under test 10 to be placed accurately within test stations 36 (e.g., with an accuracy of +/−0.1 mm or better, as an example). Test tray 32 may shield device under test 10 from scratches and other damage during testing. The cabling used to attach device under test to contacts 62 may be built into test tray 32. Loading and unloading may be facilitated using clamping structures such as movable corner 44.

Device under test 10 may be received within test tray 32 in either an upwards facing configuration in which display 14 faces outwards away from tray 32 or a downwards facing configuration in which display 14 faces downwards onto base 48 of test tray 32. As described in connection with stacking alignment feature 80 of FIG. 6, test trays 32 may, if desired, be stacked. Trays 32 may be stacked when no device under test 10 is present (i.e., when trays 32 are empty) or may be stacked following loading of device under test 10. Test stations 36 may contain detectors that can detect the presence or absence of trays 32.

Figure 7:
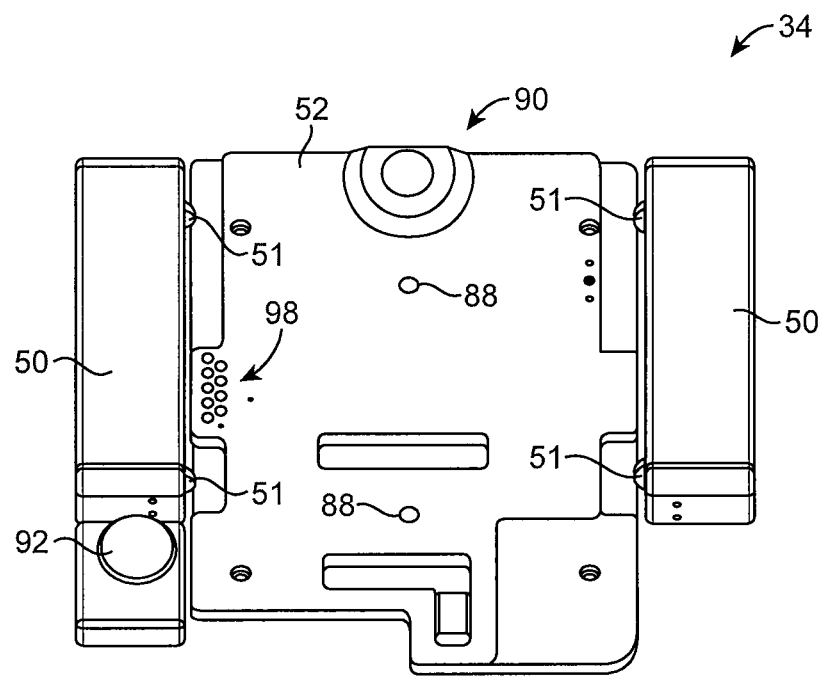
FIG. 7 is top perspective view of an illustrative test station test fixture configured to receive a test tray in accordance with an embodiment of the present invention.

Each tray 32 may contain location features such as holes 86 (FIG. 6). As shown in FIG. 7, each test station 36 (i.e., each test fixture 34) may containing mating features such as protrusions (pins) 88 that mate with features 86 and thereby accurately place tray 32 in a desired location relative to the test station. The use of holes and mating protrusions as features for aligning trays 32 relative to test fixtures 32 is merely illustrative. Alignment features of any suitable shape may be used if desired.

Each test fixture 34 may have a respective set of mating contacts (e.g., spring-loaded pins) such as mating contacts 98. Mating contacts 98 on test fixture 34 may be configured to mate and with contacts 62 on test tray 32. Because device under test 10 is connected to contacts 62 in test tray 32 using cabling associated with test tray 32, it is not necessary to repeatedly connect and disconnect device under test 10 from cabling at each test station. Rather, connections between the device under test and the test equipment at each test station by may be formed by coupling contacts 62 in test tray 32 to corresponding contacts 98 (e.g., spring-loaded pins) in each test fixture 34. By minimizing the number of times that cables need to be connected and disconnected from each device under test, the life of tester cables and connectors may be extended.

FIG. 7 shows how test fixture guide structures 50 may be provided with portions such as spring-loaded clips 51. During insertion of tray 32 into test fixture 34, sidewalls 46 of tray 32 may press clips 51 inwards. Once tray 32 has been positioned so that clips 51 are aligned with openings 60 in tray 32 (FIGS. 5 and 6), clips 51 may spring into openings 60 to secure tray 32 to fixture 34. Clips 51 may have angled surfaces that help hold test tray 32 close to base 52 of test fixture 34. During testing, clips 51 can be used to retain test tray 32 against base 52 within fixture 34.

Structures 90 may form an aperture extension for use in testing an ambient light sensor in region 26 of device under test 10. Structures 92 may be used in ejecting tray 32 from test fixture 34.

Figure 8:
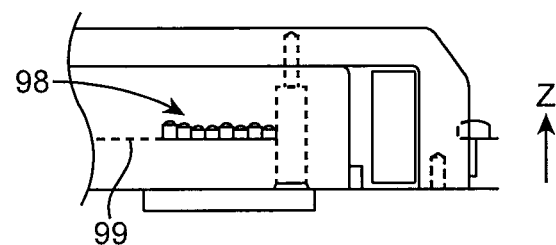
FIG. 8 is a cross-sectional side view of an illustrative test station test fixture in accordance with an embodiment of the present invention.

FIG. 8 shows a side view of contacts 98. If desired, the heights of contacts 98 with respect to surface 99 of test fixture 34 may be staggered in dimension Z to ensure that signal connections occur in a predictable order (e.g., so that a desired contact such as a ground contact makes contact before other signal paths).

Figure 9:
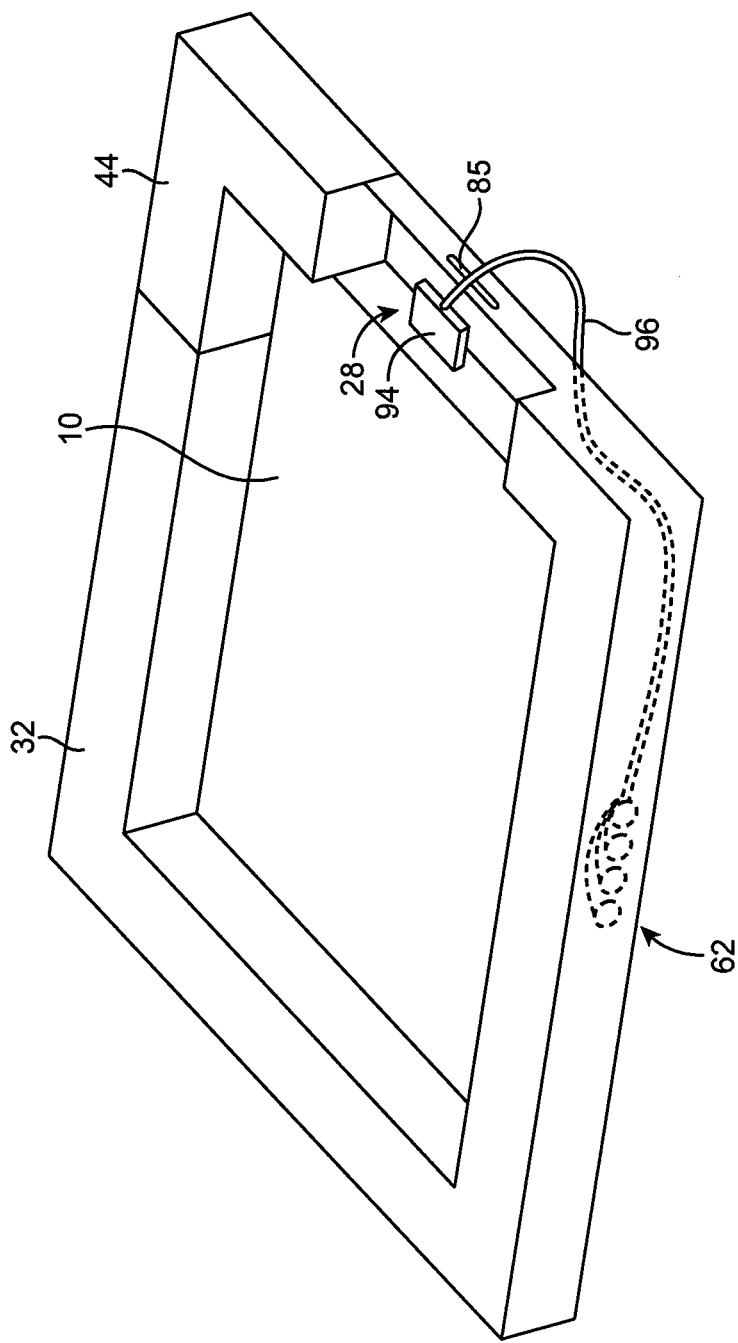
FIG. 9 is a perspective view of a test tray in which a device under test has been mounted in accordance with an embodiment of the present invention.

FIG. 9 is a perspective view of test tray 32 and device under test 10. As shown in FIG. 9, device under test 10 may be retained within test tray 32 using corner portion 44 of test tray 32. Cable 96 may have one end with wires that are connected to respective contacts 62 and may have an opposing end with a connector such as connector 94. Before installing device under test 10 in tray 32, connector 94 may be stored in slot 85. When it is desired to form an electrical connection between device under test 10 and contacts 62, an operator (or automated equipment) may remove connector 94 from slot 85 and may insert connector 94 into the connector in device under test 10 that is associated with input-output port 28. By plugging connector 94 into port 28 of device under test 10 in this way, each of contacts 62 may be connected to a respective contact in port 28. If desired, cable 96 may be embedded in tray 32 (e.g., may be embedded in a groove in tray 32 such as groove 84 of FIG. 5).

Examples of signal lines that may be contained in cable 96 include positive power supply lines, ground power supply lines, D+ and D− data lines in a Universal Serial Bus (USB) signal line pair, control lines, Universal Asynchronous Receiver/Transmitter (UART) lines, and other paths.

Figure 10:
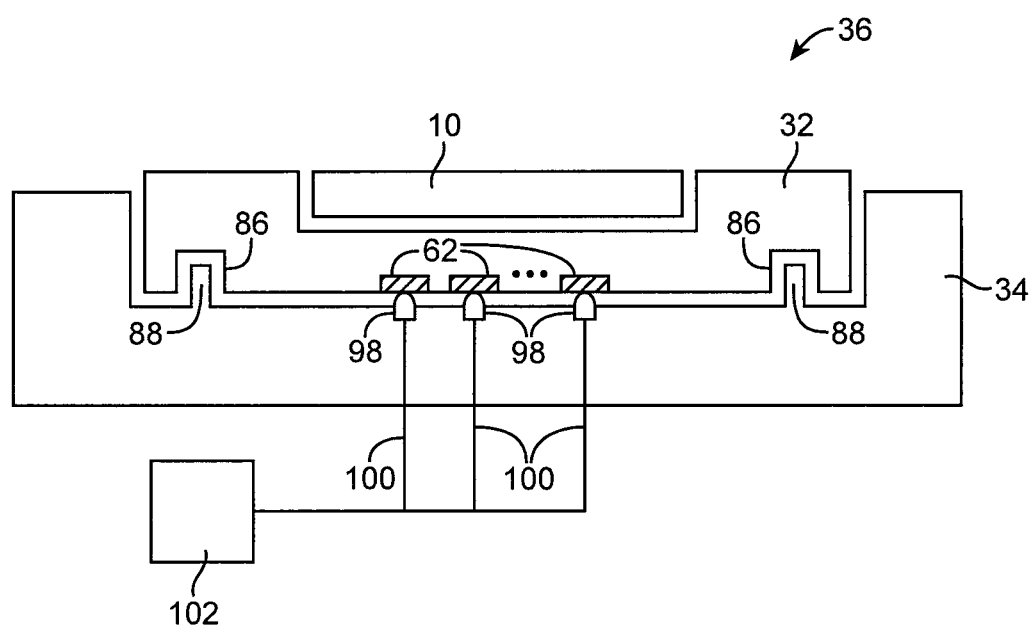
FIG. 10 is a cross-sectional side view of a device under test in a test tray that has been mounted in a mating test station test fixture in accordance with an embodiment of the present invention.

FIG. 10 is a side view of a test station in system 30. In the configuration of FIG. 10, device under test 10 has been mounted in test tray 32. Test tray 32 has been mounted in test fixture 34 at test station 36. Cable 96 (FIG. 9) may be used to electrically connect device under test 10 to contacts 62 in test tray 32. Each contact 62 may be contacted by a corresponding contact in test fixture 34, as illustrated by contacts (pins) 98. A signal path formed from signal lines 100 may be used to couple contacts 98 in test fixture 34 to test station computing equipment 102. Computing equipment 102 may be implemented using one or more computers or other test equipment. The signal path formed from signal lines 100 and cable 96 may be, for example, a Universal Serial Bus (USB) path (e.g., 1.0, 2.0, 3.0, etc.), may be an I²C path, may be a Serial Peripheral Interface (SPI) path, may be a controller area network (CAN) bus, or may be any other suitable communications path.

Figure 11:
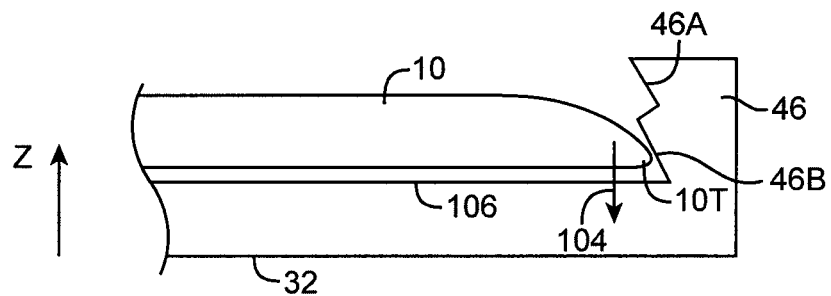
FIG. 11 is a cross-sectional side view of a device under test in an upside down configuration in a test tray in accordance with an embodiment of the present invention.
Figure 12:
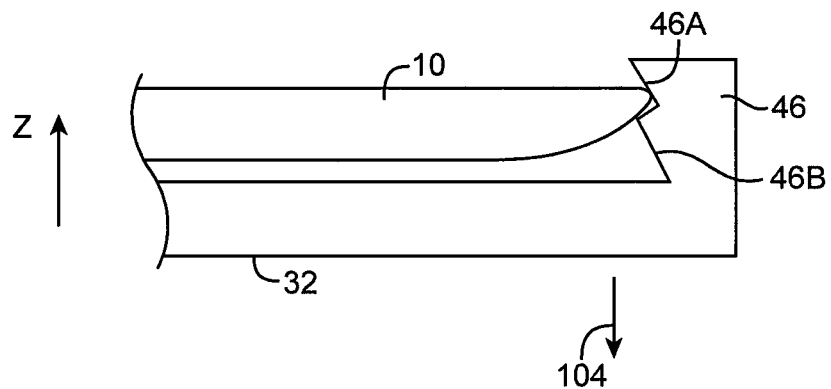
FIG. 12 is a cross-sectional side view of a device under test in a right side up configuration in a test tray in accordance with an embodiment of the present invention.

FIG. 11 is a cross-sectional side view of test tray 32 in a configuration in which sidewalls 46 have been provided with angled interior surfaces such as angled surface 46A and angled surface 46B. As shown in FIG. 11, surfaces 46A and 46B may be oriented at non-zero angles with respect to vertical dimension Z. When a device under test is placed in an upside down (inverted) orientation as with device under test 10 of FIG. 11, curved edge portion 10T of device under test 10 may be pressed downwards in direction 104 against surface 106 of test tray 32 by angled surface 46B. When the device under test is mounted in test tray 32 in a right-side up (non-inverted) configuration as shown in FIG. 12, angled surface 46A may help press device under test 10 downwards in direction 104 to retain device under test within test tray 32.

Figure 13:
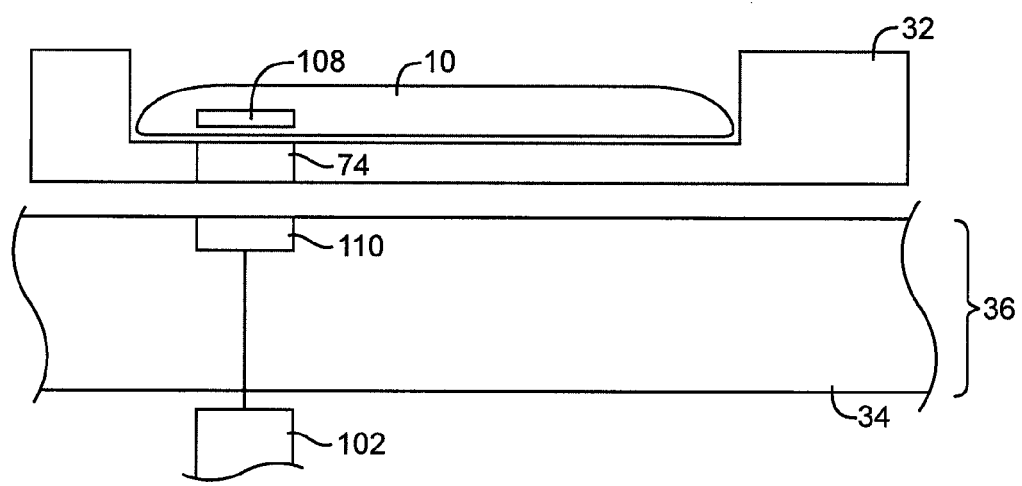
FIG. 13 is a cross-sectional side view of a device under test in a test tray with an opening to accommodate tests in accordance with an embodiment of the present invention.

FIG. 13 is a cross-sectional side view of device under test 10 mounted in test tray 32. As shown in FIG. 13, device under test 10 may contain electrical components such as component 108. Component 108 may be, for example, an ambient light sensor, a light-based proximity sensor, a capacitive sensor, a light-emitting diode (e.g., for a status indicator), a display component, a magnetic sensor, or other electrical component. Component 108 may be tested using testing equipment 110 in test fixture 34. Component 108 and testing equipment 110 may communicate through opening 74 in test tray 32.

If, as an example, component 108 is a light sensor, testing equipment 110 may be a light source that emits a calibrated light signal. The light signal from testing equipment 110 may pass through opening 74 and may be received by sensor 108. The resulting light sensor signal may be passed from device under test 10 to computing equipment 102 that is associated with test station 36 using a cable such as cable 96 and contacts 62 (FIGS. 9 and 10).

If desired, testing equipment 110 may include a magnet for testing component 108 (e.g., when component 108 is a magnetic sensor), may include an audio source for testing component 108 (e.g., when component 108 is an audio component such as a microphone), may contain a microphone for testing component 108 (e.g., when component 108 is a speaker or other audio source), may contain a light sensor for testing component 108 (e.g., when component 108 is a light source), may contain a button pressing device (e.g., when component 108 is a button), or may be based on other testing devices.

Test tray 32 may contain one opening such as opening 74 or may contain two or more openings such as opening 74. Openings such as opening 74 may, if desired, be filled with clear plastic or other window materials (e.g., for supporting optical tests). In configurations in which test tray 32 is provided with multiple openings, test station 36 may have multiple corresponding devices 110 for testing multiple corresponding components in device under test 10.

Figure 14:
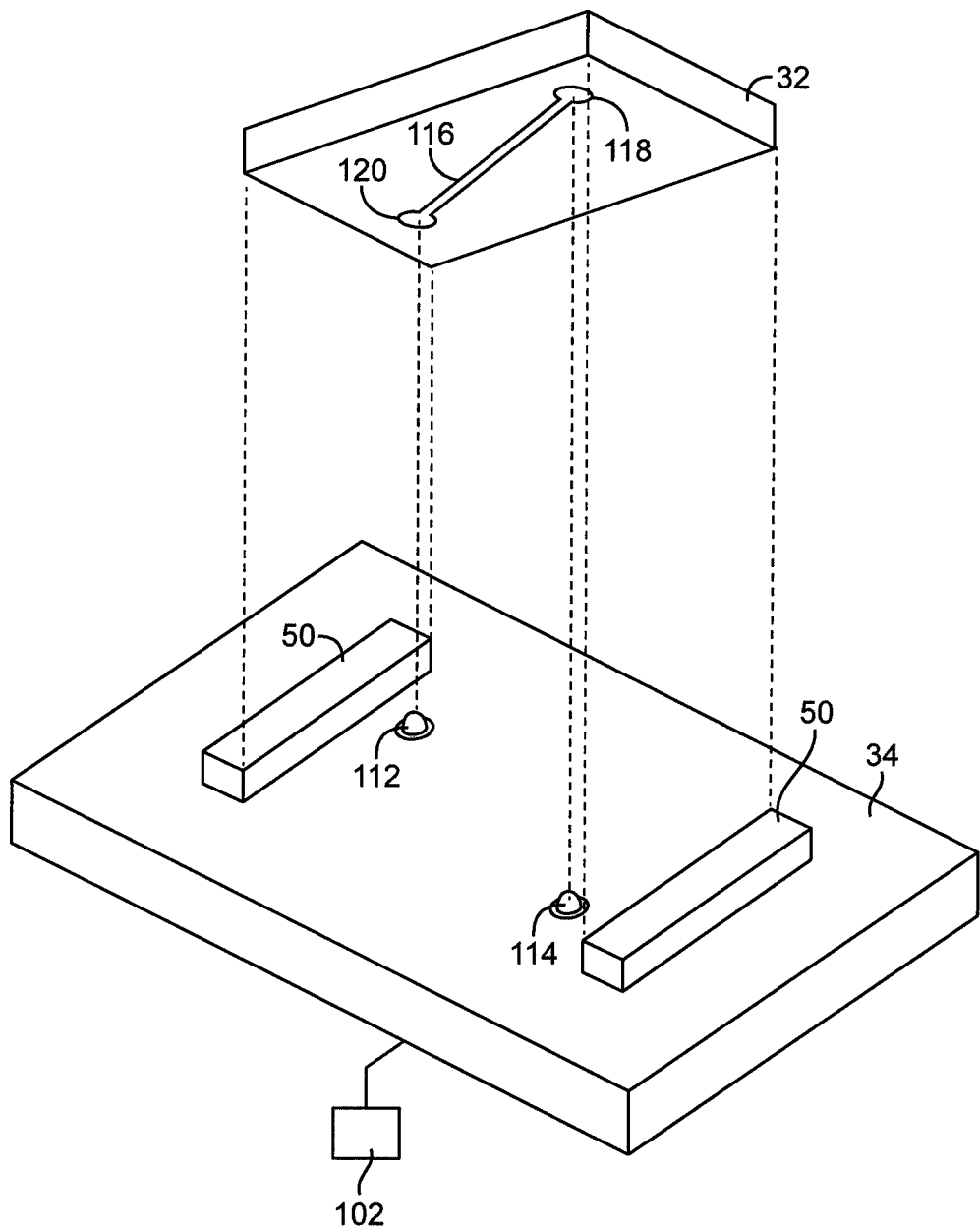
FIG. 14 is an exploded perspective view of a device under test and associated test station test fixture with a presence detection mechanism in accordance with an embodiment of the present invention.

Test stations 36 can use a short-circuit detection mechanism or other sensor to detect when test trays 32 have been mounted within test fixtures 34. As shown in FIG. 14, for example, each test tray 32 may be provided with a strip of conductor such as metal strip 116. Pads 118 and 120 may be formed at opposing ends of metal strip 116. Metal pads 118 and 120 may be configured to mate with corresponding contacts in test fixture 34 such as pins 112 and 114. Computing equipment 102 may measure the resistance between pins 112 and 114. When the resistance is high, computing equipment 102 can conclude that there is an open circuit between pins 112 and 114 and can conclude that tray 32 is not present within fixture 34. When, however, the resistance is low, computing equipment 102 can conclude that there is a short circuit between pins 112 and 114 and can conclude that tray 32 has been properly seated within test fixture 34.

Figure 15:
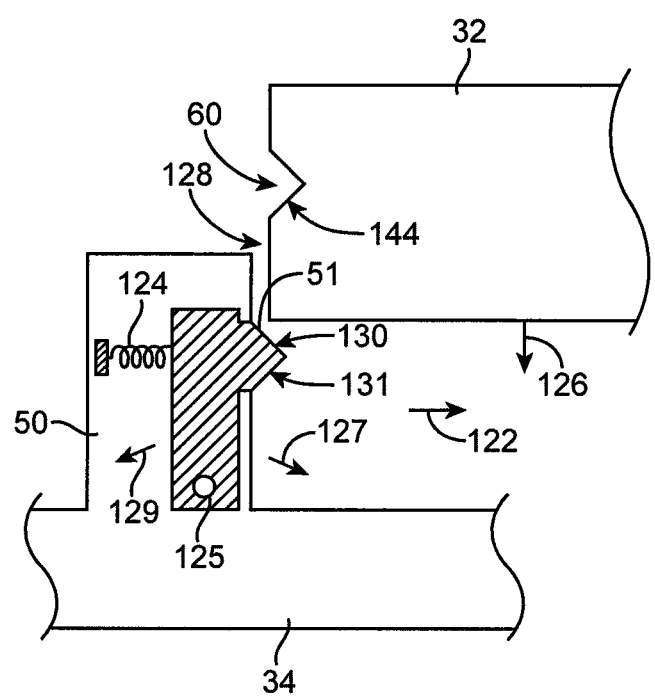
FIG. 15 is a cross-sectional side view of a test station test fixture and test tray with mating engagement features in accordance with an embodiment of the present invention.

FIG. 15 is a cross-sectional side view of test tray 32 and test fixture 34 showing how features 51 on guide structures 50 of test fixture 34 may be used to both securely fasten and accurately position test tray 32 on test fixture 34. As shown in FIG. 15, engagement features 51 may be configured to rotate on an axle or other type of hinge such as axle 125. Axle 125 may be formed in a lower portion of feature 51 and may allow an upper portion of feature 51 to move in directions 127 and 129. One or more spring-loaded members such as spring 124 may be used to bias feature 51 in direction 122.

When test tray 32 is inserted into test fixture 34 in direction 126, surface 128 of the sidewalls of test tray 32 may press against surface 130 of spring-loaded pin 51 (e.g., engagement feature 51), thereby causing the upper portion of pin 51 to retract into structure 50 in direction 129. Once opening 60 has been brought into alignment with pin 51, spring 124 may force the upper portion of pin 51 into opening 60 in direction 127. Because feature 51 rotates about axle 125, some of the spring force provided by spring 124 will be directed downwards in direction 126, thereby causing surface 131 of feature 51 to press down on surface 144 of test tray 32 in direction 126. This may ensure that test tray 32 is both securely fastened to test fixture 34 and that test tray 32 is positioned in a known location relative to test fixture 34 (e.g., feature 51 may be used to position test tray 32 as close as possible to test fixture 34).

Figure 16:
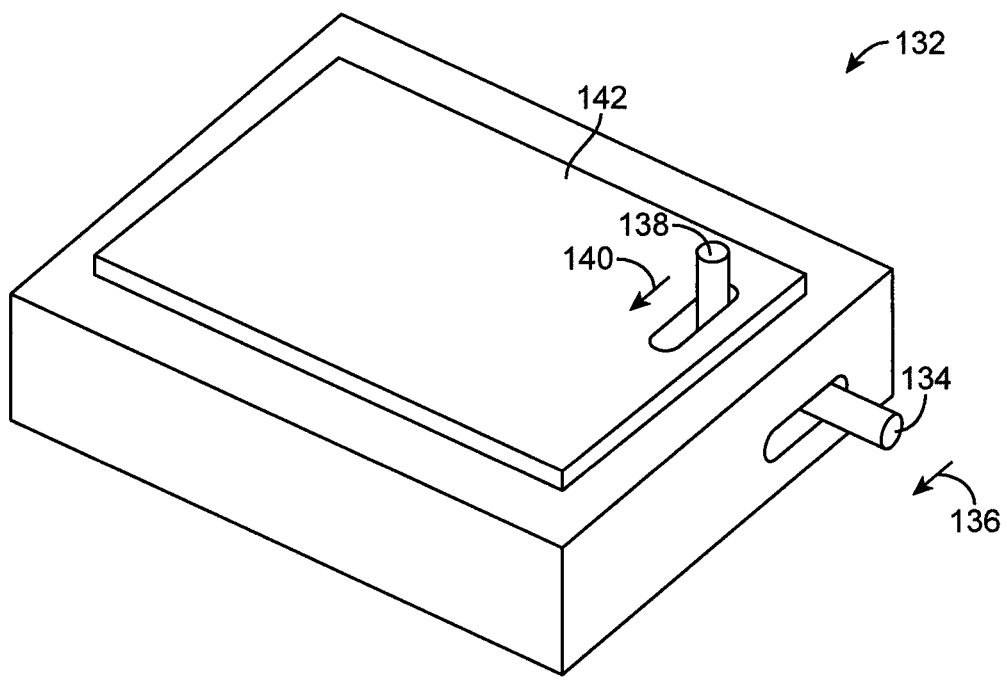
FIG. 16 is a perspective view of an illustrative automated test tray loader that may be used to assist an operator in loading devices under test into test trays in accordance with an embodiment of the present invention.

It may be desirable to provide a test system operator with assistance in moving corner portion 44 of tray 32 in direction 59. FIG. 16 is a perspective view of an illustrative loader that may be used in moving corner portion 44 of tray 32. As shown in FIG. 16, loader 132 may have a guide plate such as plate 142. An operator may place test tray 32 face up on plate 142, so that plate 142 is received within the walls of test tray 32 and so that member 138 rests against lever 66 in test tray 32 (FIG. 6). The operator (or a computer-controlled actuator) may then move member 134 in direction 136. Movement of member 134 in direction 136 may cause member 138 to move in direction 140, thereby moving lever 66 of test tray 32 in direction 70 and moving corner 44 in direction 59 to receive a device under test.

The foregoing is merely illustrative of the principles of this invention and various modifications can be made by those skilled in the art without departing from the scope and spirit of the invention.

What is claimed is:

1. Test apparatus for housing a device under test during testing, comprising:
 a device under test receiving structure configured to receive a device under test;
 at least one movable portion of the device under test receiving structure that is configured to hold the device under test within the device under test receiving structure;
 an actuating member configured to move the movable portion to release the device under test from the device under test receiving structure;
 a plurality of contacts configured to electrically couple the device under test to a test station during testing;
 a cable having a first and second ends, wherein the first end is electrically coupled to the plurality of contacts and wherein the second end is configured to mate with an input-output port in the device under test; and a groove formed in the device under test receiving structure, wherein the device under test receiving structure comprises first and second opposing surfaces, wherein the first surface comprises a planar portion, wherein the groove comprises a recessed portion in the planar portion of the first surface, wherein the cable is embedded in the groove such that a portion of the cable protrudes into the recessed portion below the planar portion of the first surface, and wherein the second surface comprises an additional recessed portion in which the device under test is received.

2. The test apparatus defined in claim 1, wherein the at least one movable portion comprises a movable corner portion and wherein the movable corner portion is biased towards a central portion of the device under test receiving structure.

3. The test apparatus defined in claim 2, wherein the movable corner portion comprises at least one spring-loaded member.

4. The test apparatus defined in claim 1, wherein the device under test receiving structure comprises a base portion and at least one sidewall, wherein the base portion and the at least one sidewall define the additional recessed portion, and wherein the movable portion is configured to hold the device under test within the additional recessed portion.

5. The test apparatus defined in claim 1, wherein the cable comprises a signal line selected from the group consisting of: a positive power supply line, a ground power supply line, a data line, a Universal Serial Bus signal line, a Universal Asynchronous Receiver/Transmitter line, and a control line.

6. The test apparatus defined in claim 1, wherein the device under test receiving structure is rotatable about a rotational axis and wherein the device under test receiving structure comprises at least one weight balancing feature configured to balance a weight of the device under test receiving structure with respect to the rotational axis when the device under test is received within the device under test receiving structure.

7. The test apparatus defined in claim 6, wherein the at least one weight balancing feature comprises a plurality of holes in the device under test receiving structure.

8. A test system for testing a device under test comprising:
a test tray configured to receive the device under test, wherein the test tray includes a plurality of test tray contacts configured to be electrically coupled to the device under test when the device under test is received by the test tray; and
a test fixture configured to receive the test tray, wherein the test fixture includes a plurality of test fixture contacts configured to mate with the plurality of test tray contacts when the test tray is received by the test fixture, wherein the device under test comprises an ambient light sensor, wherein the test fixture comprises test equipment for testing the ambient light sensor, wherein the test tray comprises first and second opposing surfaces, wherein the test tray comprises sidewalls that extend from the first surface to surround the device under test and at least one opening that extends from the first surface to the second surface, wherein light signals are exchanged through the opening between the test equipment and the ambient light sensor.

9. The test system defined in claim 8, wherein the test tray comprises a cable having first and second ends, wherein the first end is electrically coupled to the plurality of test tray contacts, wherein the second end is configured to mate with a connector in the device under test, and wherein the cable is configured to convey signals between the device under test and the plurality of test tray contacts.

10. The test system defined in claim 8, wherein the plurality of test tray contacts comprises a plurality of contact pads and wherein the plurality of test fixture contacts comprises a plurality of conductive pins.

11. The test system defined in claim 10, wherein the plurality of conductive pins comprises a plurality of spring-loaded pins, wherein each spring-loaded pin in the plurality of spring-loaded pins has an associated height with respect to a surface of the test fixture, and wherein the heights of at least two spring-loaded pins in the plurality of spring-loaded pins are different.

12. The test system defined in claim 8, wherein the test fixture comprises a plurality of test fixture engagement features, wherein the test tray comprises a plurality of test tray engagement features, and wherein the test fixture engagement features are configured to engage with the test tray engagement features when the test tray is received by the test fixture.

13. The test system defined in claim 12, wherein at least one test fixture engagement feature in the plurality of test fixture engagement features comprises a spring-loaded member.

14. The test system defined in claim 13, wherein at least one test tray engagement feature in the plurality of test tray engagement features comprises a recess.

15. The test system defined in claim 8, wherein the test fixture comprises a test tray detector configured to detect whether or not the test tray is present on the test fixture.

16. The test system defined in claim 8, wherein the device under test comprises an electrical component, wherein the test fixture comprises test equipment for testing the electrical component, and wherein the test tray comprises at least one additional opening through which the test equipment and the electrical component communicate.

17. The test system defined in claim 8, wherein the test tray comprises a movable portion that is configured to move with respect to a central portion of the test tray and that is configured to hold the device under test within the test tray.

18. The test system defined in claim 17, wherein the test tray further comprises an actuating member configured to move the movable portion to release the device under test from the test tray.

19. The test system defined in claim 18, wherein the movable portion comprises a movable corner portion and wherein the movable corner portion is biased towards the central portion.

20. Test apparatus for housing a device under test during testing, comprising:
a device under test receiving structure configured to receive a device under test, wherein the device under test receiving structure comprises a base portion on which the device under test rests and at least one sidewall, wherein the base portion and the at least one sidewall define a substantially rectangular recessed portion with four corners;
at least one movable portion of the device under test receiving structure that is configured to hold the device under test within the device under test receiving structure, wherein the at least one movable portion comprises a movable corner portion that makes up a selected one of the four corners; and
an actuating member configured to move the movable portion to release the device under test from the device under test receiving structure.

21. The test apparatus defined in claim 20, wherein the movable corner portion is biased towards a central portion of the device under test receiving structure.

22. The test apparatus defined in claim 21, wherein the movable corner portion comprises at least one spring-loaded member.

23. The test apparatus defined in claim 22, wherein the movable corner portion is configured to hold the device under test within the recessed portion.

24. The test apparatus defined in claim 23, wherein the base portion of the device under test receiving structure, the movable corner portion, and the spring-loaded member are coplanar.

* * * * *